United States Patent
Bartley et al.

(10) Patent No.: US 6,998,852 B2
(45) Date of Patent: Feb. 14, 2006

(54) METHOD AND APPARATUS FOR IMPLEMENTING DIRECT ATTENUATION MEASUREMENT THROUGH EMBEDDED STRUCTURE EXCITATION

(75) Inventors: Gerald Keith Bartley, Rochester, MN (US); Darryl John Becker, Rochester, MN (US); Paul Eric Dahlen, Rochester, MN (US); Philip Raymond Germann, Oronoco, MN (US); Andrew B. Maki, Rochester, MN (US); Mark Owen Maxson, Mantorville, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/879,813

(22) Filed: Jun. 29, 2004

(65) Prior Publication Data
US 2005/0285600 A1 Dec. 29, 2005

(51) Int. Cl.
*G01R 31/08* (2006.01)
(52) U.S. Cl. .................................... 324/523
(58) Field of Classification Search ................. 324/523; 385/95, 96; 356/369; 379/24
See application file for complete search history.

(56) References Cited

U.S. PATENT DOCUMENTS 4,663,775 A * 5/1987 Olek ........................... 379/24
6,676,307 B1 * 1/2004 Yang et al. .................. 385/96

* cited by examiner

Primary Examiner—Vincent Q. Nguyen
(74) Attorney, Agent, or Firm—Joan Pennington

(57) ABSTRACT

A method and apparatus are provided for implementing direct attenuation loss measurement in an electronic package. A sinusoidal voltage source signal of a selected frequency is coupled to an embedded transmission line test structure in the electronic package. Receive circuitry is coupled to the transmission line test structure for detecting amplitude of a received sinusoidal voltage source signal to identify attenuation loss through the transmission line test structure. An identified attenuation loss of the transmission line test structure is compared with a threshold value for verifying acceptable attenuation of the electronic package transmission line test structure.

14 Claims, 4 Drawing Sheets

METHOD AND APPARATUS FOR IMPLEMENTING DIRECT ATTENUATION MEASUREMENT THROUGH EMBEDDED STRUCTURE EXCITATION

FIELD OF THE INVENTION

The present invention relates to a method and apparatus for implementing direct attenuation measurement in an electronic package through embedded structure excitation.

DESCRIPTION OF THE RELATED ART

Measuring attenuation loss directly in electronic package designs is difficult and requires significant capital equipment investment. Presently employed methods for verifying attenuation loss in electronic package designs typically are difficult, inefficient, inconsistent and far too cumbersome to provide adequate process control test coverage in a high volume test environment.

Less expensive solutions can be used, but these solutions target only specific components of the attenuation loss characteristics, such as resistance (Rdc). These techniques tend to produce indeterminate results by only addressing the skin effect portion of attenuation and therefore tend to understate the attenuation loss of a given package.

More expensive solutions are able to more accurately quantify the attenuation on a lot to lot basis with a dependency on expensive external test equipment and advanced user education, but the results typically are inconsistent and cannot characterize variation within the lot measurement method is time consuming and far too cumbersome to be used in a volume production environment.

A need exists for an effective mechanism for implementing consistent verification of attenuation loss in electronic package designs that can be employed in high volume test environments. It is desirable to provide such mechanism that allows for a simple pass/fail indication.

SUMMARY OF THE INVENTION

A principal aspect of the present invention is to provide a method and apparatus for implementing direct attenuation measurement in an electronic package. Other important aspects of the present invention are to provide such a method and apparatus for implementing direct attenuation measurement substantially without negative effect and that overcome many of the disadvantages of prior art arrangements.

In brief, a method and apparatus are provided for implementing direct attenuation loss measurement in an electronic package. A sinusoidal voltage source signal of a selected frequency is coupled to an embedded transmission line test structure in the electronic package. Receive circuitry is coupled to the transmission line test structure for detecting amplitude of a received sinusoidal voltage source signal to identify attenuation loss through the transmission line test structure. An identified attenuation loss of the transmission line test structure is compared with a threshold value for verifying acceptable attenuation of the electronic package transmission line test structure.

In accordance with one embodiment of the invention, the receive circuitry includes a peak detect comparator coupled to the transmission line test structure for detecting attenuation of the sinusoidal voltage source signal through the transmission line test structure. A copy of the sinusoidal voltage source signal of the selected frequency is applied to a filter for attenuating the signal amplitude to the threshold value. The filtered copy of the sinusoidal voltage source signal of the selected frequency is coupled to peak detect comparator. A pass or fail indication is produced for the transmission line test structure responsive to an output of the peak detect comparator.

In accordance with another embodiment of the invention, the receive circuitry includes impedance detecting circuitry coupled to a first of a pair of substantially identical transmission line test structures. The first transmission line test structure is analyzed and the impedance detecting circuitry sets matching drive and receive termination values for the second transmission line test structure. Attenuation calculation circuitry is coupled to sinusoidal voltage source receiving test amplitude and frequency signals and to the receive circuitry receiving the detected amplitude of a received sinusoidal voltage source signal through the second transmission line test structure for calculating attenuation loss. Logic circuitry is coupled to the attenuation calculation circuitry for comparing the calculated attenuation with the threshold value.

In accordance with another embodiment of the invention, the receive circuitry includes impedance detecting circuitry and control circuitry to connect impedance detecting circuitry and the receive circuitry to a single transmission line test structure. The impedance detecting circuitry sets a known termination value, and then the impedance detecting circuitry determines a characteristic impedance of the transmission line test structure. Then the impedance detecting circuitry sets matching drive and receive termination values for the transmission line test structure. Then the receive circuitry is connected to the transmission line test structure. Attenuation calculation circuitry is coupled to sinusoidal voltage source receiving test amplitude and frequency signals and to the receive circuitry receiving the detected amplitude of a received sinusoidal voltage source signal through the second transmission line test structure for calculating attenuation loss. Logic circuitry is coupled to the attenuation calculation circuitry for comparing the calculated attenuation with the threshold value.

In accordance with features of the invention the identified attenuation loss of the transmission line test structure includes both conductor loss and dielectric loss. Either or both frequency and amplitude of the sinusoidal voltage source signal coupled to the transmission line test structure can be modified to verify attenuation loss for the electronic package at multiple measurements.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features of the preferred embodiment, a method is provided for verifying attenuation loss of an electronic package through the utilization of a single electronic integrated circuit device, thereby making attenuation loss measurement very repeatable and easily interpretable in a production and manufacturing environment.

Figure 1:
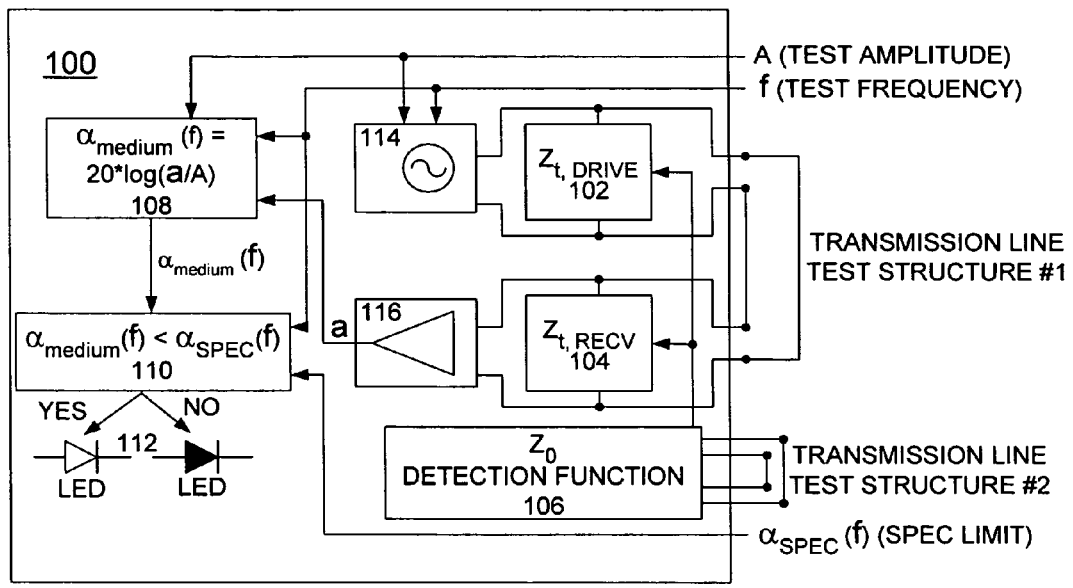
FIGS. 1, 2, and 3 are schematic diagrams illustrating alternative apparatus for implementing automated electronic package attenuation loss verification in accordance with the preferred embodiments.
Figure 2:
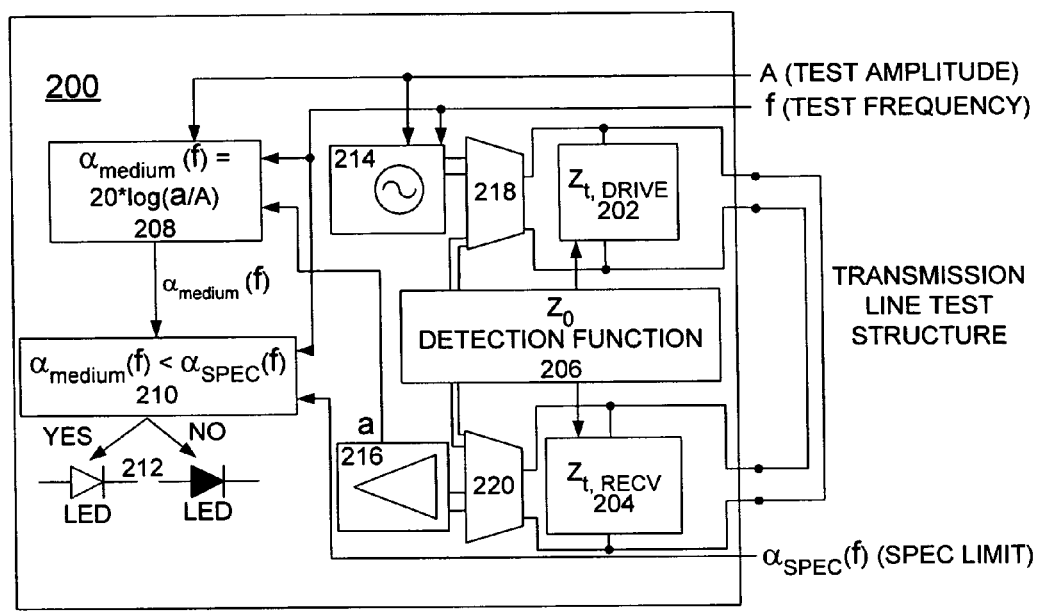

Having reference now to the drawings, two embodiments of the invention respectively are illustrated in FIGS. 1 and 2. In FIG. 1, there is shown exemplary apparatus for implementing automated electronic package attenuation loss verification generally designated by the reference character 100 in accordance with one preferred embodiment. In FIG. 2, there is shown another exemplary apparatus for implementing automated electronic package attenuation loss verification generally designated by the reference character 200 in accordance with another preferred embodiment.

Figure 3:
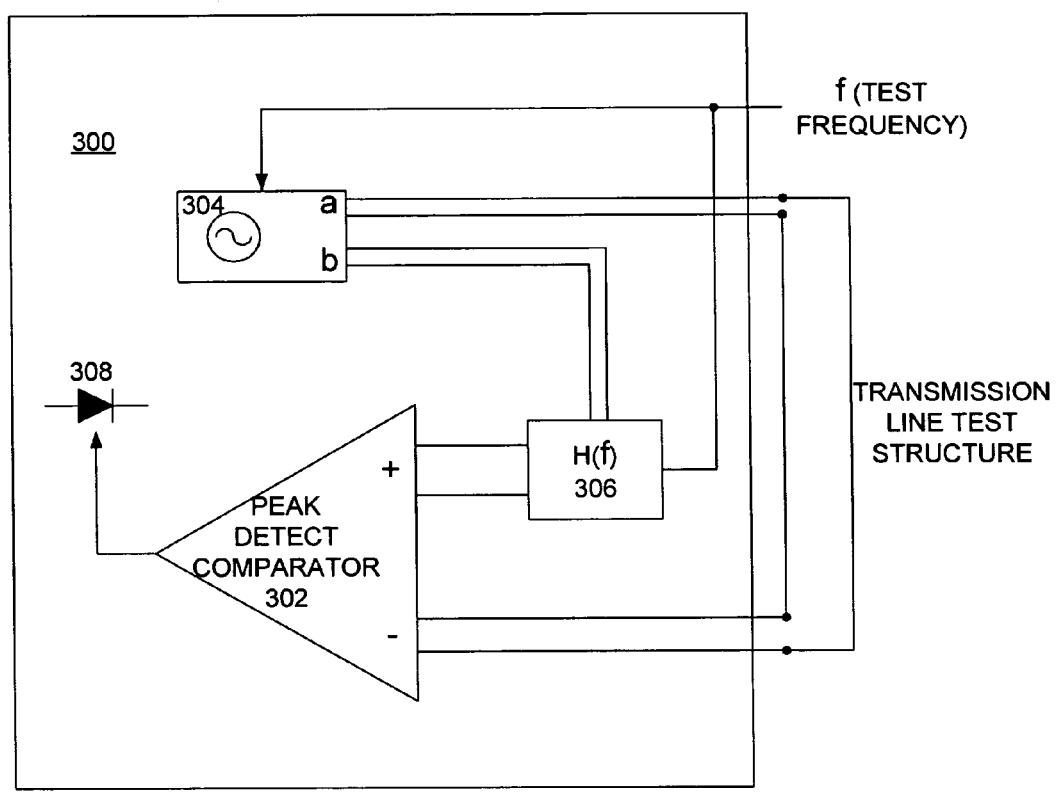

Referring also to FIG. 3, there is shown another exemplary apparatus for implementing automated electronic package attenuation loss verification generally designated by the reference character 300 in accordance with one preferred embodiment. In each of the embodiments 100, 200, 300 one or more test traces or transmission line test structures, labeled TRANSMISSION LINE TEST STRUCTURE #1, and TRANSMISSION LINE TEST STRUCTURE #2 in FIG. 1 and TRANSMISSION LINE TEST STRUCTURE in FIGS. 2 and 3, are built into or embedded within an electronic package design and then internal circuitry of an electronic integrated circuit device respectively defining apparatus 100, apparatus 200 or apparatus 300 uses these traces to directly determine attenuation loss in the electronic package design.

In FIGS. 1 and 2, the difference between the apparatus 100 and apparatus 200 is the determination of the drive and receive termination values. FIG. 1 depicts an embodiment where a pair of substantially identical test traces is designed and then one is analyzed and sets the termination values for the other. FIG. 2 depicts a case where the same test structure is utilized with control circuitry to connect a Zo detection function to the test trace first with termination values set to a known value, determine the test structure characteristic impedance, set the termination values, then connect the attenuation measurement circuitry to the test structure.

In FIG. 3, one single integrated circuit that can be a stand-alone device or be embedded into a package test unit implements apparatus 300 containing all the required function circuitry. Apparatus 300 is superior to other competing methods in that matched termination at the drive and receive ends of the test structures is not required to achieve reasonable results. A filtered peak detect comparator 302 is used to determine whether the attenuation loss of a given package design test structure is within specified design limits. These limits involve an allowable predefined signal amplitude reduction at a given frequency.

In accordance with features of the preferred embodiments of FIGS. 1, 2, and 3, sinusoidal signals of predetermined frequencies are then driven into a test structure, then receive circuitry at end of the test structure determines if the test structure meets predetermined attenuation loss limits. Containing all the function of respective apparatus 100, 200, 300 into a single integrated device is superior to conventional arrangements that generally are inaccurate, for example, due to variation in probing techniques, analyzer calibration and variations between analyzers from different manufacturers.

Referring to FIG. 1, apparatus 100 includes a pair of impedance matching drive and receive termination circuits 102, 104 coupled to a first transmission line test structure #1, and an impedance measuring circuitry labeled Zo detection function 106 coupled to a second transmission line test structure #2. Apparatus 100 includes an attenuation calculation block 108, logic circuitry 110, display 112, a sinusoidal voltage source 114, and a receive amplitude detecting circuitry 116 coupled to the first transmission line test structure #1.

The impedance detecting circuitry 106 analyzes the transmission line test structure #2. Then the impedance detecting circuitry 106 sets matching drive and receive termination values for termination circuits 102, 104 for the transmission line test structure #1. This insures that there are no signals reflected at either the drive or receive ends of the transmission line test structure, and enables an accurate attenuation measurement. Attenuation calculation circuitry 108 is coupled to sinusoidal voltage source 114 receiving test amplitude and frequency signals and to the amplitude detecting circuitry 116 receiving the detected amplitude of a received sinusoidal voltage source signal through the transmission line test structure #1 for calculating attenuation loss. Logic circuitry 110 is coupled to the attenuation calculation circuitry for comparing the calculated attenuation with the threshold value.

The sinusoidal voltage source 114 then drives the test amplitude A down the transmission line test structure or medium at test frequency f. The amplitude and/or the frequency can be modified to provide thorough testing of the structure. The receive amplitude detecting circuitry 116 receives the signal and generates at its output the amplitude of the received waveform indicated by a. All three variables A (test amplitude), f (test frequency) and a (the received waveform) are fed into the attenuation calculation function 108, which quantifies the attenuation of the medium at the test frequency, $\alpha$medium (f); defined as:

$$\alpha\text{medium } (f)=20*\log (a/A)$$

The attenuation loss of the medium is then fed into the logic circuitry verification function 110, which compares the loss of the medium $\alpha$medium (f) to the predetermined threshold value or maximum allowable loss $\alpha$SPEC (f). The logic circuitry verification function 110 determines if the medium loss is acceptable and provides a pass or fail indication with LED display 112.

Referring to FIG. 2, apparatus 200 includes a pair of impedance matching drive and receive termination circuits 202, 204 and an impedance measuring circuitry labeled Zo detection function 206 coupled to a single transmission line test structure. Apparatus 200 includes an attenuation calculation block 208, a logic circuitry 210, a display 212, a sinusoidal voltage source 214, a receive amplitude circuitry 216 and a pair of control circuitry 218, 220.

The impedance detecting circuitry 206 sets a known termination value for drive and receive termination circuits 202, 204, then the impedance Zo detection function 206 coupled to the transmission line test structure by the control circuitry 218, 220 determines a characteristic impedance of the transmission line test structure. This insures that there are no signals reflected at either the drive or receive ends of the transmission line test structure, and enables an accurate attenuation measurement. Then the impedance detecting circuitry 206 sets matching drive and receive termination values for the transmission line test structure. Then the receive circuitry 216 is connected to the transmission line test structure by the control circuitry 218, 220. Attenuation calculation circuitry 208 is coupled to sinusoidal voltage source 214 receiving test amplitude A and frequency f signals and to the receive circuitry 216 receiving the detected amplitude signal a from a received sinusoidal voltage source signal through the second transmission line test structure for calculating attenuation loss. Logic circuitry 210 is coupled to the attenuation calculation circuitry 208. The logic circuitry verification function 210 compares the loss of the transmission line test structure $\alpha$medium (f) to the predetermined threshold value or maximum allowable loss $\alpha$SPEC (f). The logic circuitry verification function 210 determines if the medium loss is acceptable and provides a pass or fail indication with LED display 212.

Referring to FIG. 3, apparatus 300 includes a peak detect comparator 302, a sinusoidal voltage source 304, a filter circuitry 306, and a display 308. In apparatus 300, the amplitude of the sinusoidal voltage source signal does not require tight control nor does it need to be known. Also the test frequency can be controlled at both the source and the filter 306 via mode control such that attenuation loss of a package structure may be evaluated at multiple frequency points.

In the apparatus 300, an output signal of the sinusoidal voltage source 304 of a known frequency, indicated as output a, is presented to the transmission line test structure of a particular electronic package. A copy of the source signal indicated as output b is presented to the filter 306, which attenuates the signal amplitude to some, predetermined specified limit at a given frequency. Both the input test frequency and the filter mode frequency can be adjusted by a conventional mode control technique, or the filter and signal source may be fixed at one frequency to reduce test circuit complexity and testing complexity.

Both the filtered copy of the sinusoidal voltage source signal and the sinusoidal voltage source signal that is transmitted through the test structure are presented to the peak detect comparator circuit 302. The peak detect comparator circuit 302 is used to determine whether the attenuation loss within the test structure is within the predetermined specified limits. The peak detect comparator circuit 302 is arranged to accommodate the attenuation loss and threshold value comparison with the phase relationship caused by the difference in time of flight between the transmission line test structure and the filtered signal. A simple pass/fail indication is produced by the display LED 308 responsive to an output of peak detect comparator circuit 302.

The apparatus 300 of the invention is superior to other competing methods in that matched termination at the drive and receive ends of the test structures is not required to achieve reasonable results. It can be shown that with low source output impedance, such as approximately 5 ohms, coupled with relatively high input impedance of the filter network, such as approximately 1 K ohms, that the error term associated with a given test structure in specified limits for characteristic impedance (+/−10%) is less than 1 percent.

Figure 4:
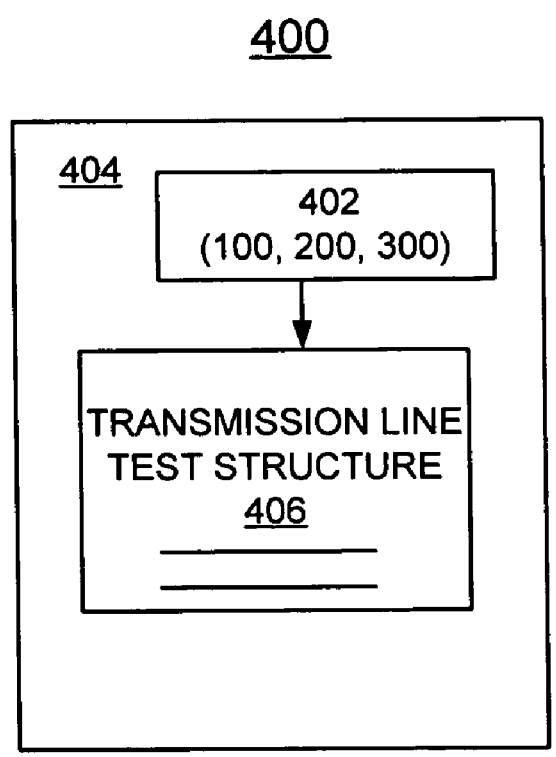
FIG. 4 illustrates an electronic unit in accordance with a preferred embodiment of the apparatus of FIGS. 1, 2, and 3.

Referring to FIG. 4, there is shown an electronic unit generally designated by the reference character 400 in accordance with a preferred embodiment. Electronic unit includes a single integrated circuit device 402 and a card or multi-chip module 404.

In a first embodiment, the single integrated circuit device 402 includes the impedance matching circuitry 102, 104, the impedance measuring circuitry 106; the attenuation calculation block 108, logic circuitry 110, display 112, sinusoidal voltage source 114, and receive amplitude circuitry 116 of the apparatus 100. In a second embodiment, the single integrated circuit device 402 includes the impedance matching circuitry 202, 204, the impedance measuring circuitry 206; the attenuation calculation block 208, logic circuitry 210, display 212, sinusoidal voltage source 214, receive amplitude circuitry 216 and control circuitry 218, 220 of the apparatus 200. In a third embodiment, the single integrated circuit device 402 includes the peak detect comparator 302, sinusoidal voltage source 304; filter circuitry 306 of the apparatus 300.

A transmission line test structure 406 representing conductors on the card or multi-chip module 404 respectively defines the transmission line test structures #1, #2 of FIG. 1 or the single transmission line test structure of FIGS. 2 and 3. The single integrated circuit device 402 of apparatus 100, of apparatus 200 and of apparatus 300 is located on or is included in the card or multi-chip module 404 for the respective transmission line test structures.

While the present invention has been described with reference to the details of the embodiments of the invention shown in the drawing, these details are not intended to limit the scope of the invention as claimed in the appended claims.

What is claimed is:

1. Apparatus for implementing direct attenuation loss measurement in an electronic package comprising:

a sinusoidal voltage source providing a sinusoidal voltage source signal of a selected frequency; said sinusoidal voltage source signal coupled to a transmission line test structure of the electronic package;

receive circuitry coupled to the transmission line test structure for detecting a received sinusoidal voltage source signal to identify attenuation loss through the transmission line test structure; said attenuation loss of the transmission line test structure including both conductor loss and dielectric loss; and compare circuitry for comparing an attenuation loss of the transmission line test structure with a threshold value for verifying acceptable attenuation of the electronic package transmission line test structure.

2. Apparatus for implementing direct attenuation loss measurement as recited in claim 1 wherein said receive circuitry includes a peak detect comparator coupled to the transmission line test structure.

3. Apparatus for implementing direct attenuation loss measurement as recited in claim 2 wherein a copy of the sinusoidal voltage source signal of the selected frequency is applied to a filter for attenuating the signal amplitude equal to said threshold value; and said filtered copy of the sinusoidal voltage source signal of the selected frequency is coupled to said peak detect comparator.

4. Apparatus for implementing direct attenuation loss measurement as recited in claim 2 wherein a pass or fail indication is produced for the transmission line test structure responsive to an output of the peak detect comparator.

5. Apparatus for implementing direct attenuation loss measurement as recited in claim 1 wherein said receive circuitry includes an impedance detecting circuitry coupled to a first of a pair of substantially identical transmission line test structures; said impedance detecting circuitry analyzes the first transmission line test structure and said impedance detecting circuitry sets substantially matching drive and receive termination values for a second pair of substantially identical transmission line test structures.

6. Apparatus for implementing direct attenuation loss measurement as recited in claim 5 further includes attenuation calculation circuitry coupled to said sinusoidal voltage source receiving test amplitude and frequency signals and to said receive circuitry receiving the detected amplitude of a received sinusoidal voltage source signal through the second transmission line test structure for calculating attenuation loss.

7. Apparatus for implementing direct attenuation loss measurement as recited in claim 6 further includes logic circuitry is coupled to said attenuation calculation circuitry for comparing the calculated attenuation loss with said threshold value.

8. Apparatus for implementing direct attenuation loss measurement as recited in claim 1 wherein said receive circuitry includes impedance detecting circuitry and control circuitry to connect said impedance detecting circuitry and said receive circuitry to a single transmission line test structure.

9. Apparatus for implementing direct attenuation loss measurement as recited in claim 8 wherein said impedance detecting circuitry sets a known termination value, the impedance detecting circuitry determines a characteristic impedance of the transmission line test structure and the impedance detecting circuitry sets matching drive and receive termination values for the transmission line test structure.

10. Apparatus for implementing direct attenuation loss measurement as recited in claim 9 wherein said control circuitry responsive to said impedance detecting circuitry setting said matching drive and receive termination values for connecting said receive circuitry to the transmission line test structure.

11. Apparatus for implementing direct attenuation loss measurement as recited in claim 10 further includes attenuation calculation circuitry coupled to said sinusoidal voltage source receiving test amplitude and frequency signals and to said receive circuitry receiving the detected amplitude of a received sinusoidal voltage source signal through the transmission line test structure for calculating attenuation loss.

12. Apparatus for implementing direct attenuation loss measurement as recited in claim 11 further includes logic circuitry coupled to said attenuation calculation circuitry for comparing the calculated attenuation with the threshold value.

13. Apparatus for implementing direct attenuation loss measurement in an electronic package comprising:
   a sinusoidal voltage source providing a sinusoidal voltage source signal of a selected frequency; said sinusoidal voltage source signal coupled to a transmission line test structure of the electronic package;
   receive circuitry coupled to the transmission line test structure for detecting a received sinusoidal voltage source signal to identify attenuation loss through the transmission line test structure;
   compare circuitry for comparing an attenuation loss of the transmission line test structure with a threshold value for verifying acceptable attenuation of the electronic package transmission line test structure; and
   a selected one of or both frequency and amplitude of the sinusoidal voltage source signal coupled to the transmission line test structure being modified to verify attenuation loss for the electronic package at multiple measurements.

14. An electronic unit comprising:
   a transmission line test structure; and
   a single integrated circuit device for implementing direct attenuation loss measurement in an electronic package; said single integrated circuit device including:
   a sinusoidal voltage source providing a sinusoidal voltage source signal of a selected frequency; said sinusoidal voltage source signal coupled to a transmission line test structure of the electronic package;
   receive circuitry coupled to the transmission line test structure for detecting a received sinusoidal voltage source signal to identify attenuation loss through the transmission line test structure;
   compare circuitry for comparing an attenuation loss of the transmission line test structure with a threshold value for verifying acceptable attenuation of the electronic package transmission line test structure; and
   a selected one of or both frequency and amplitude of the sinusoidal voltage source signal coupled to the transmission line test structure being modified to verify attenuation loss for the electronic package at multiple measurements.

* * * * *